US007298225B2

(12) United States Patent
Sze et al.

(10) Patent No.: US 7,298,225 B2
(45) Date of Patent: Nov. 20, 2007

(54) SIGNAL MODULATED VOLTAGE CONTROLLED OSCILLATOR SYSTEM

(75) Inventors: Bour-Yi Sze, Taichung (TW); Chih-Long Ho, Taipei (TW); Da-Wei Sung, Kaohsiung (TW)

(73) Assignee: VIA Technologies, Inc., Taipei (TW)

( * ) Notice: Subject to any disclaimer, the term of this patent is extended or adjusted under 35 U.S.C. 154(b) by 187 days.

(21) Appl. No.: 11/048,151

(22) Filed: Jan. 31, 2005

(65) Prior Publication Data
US 2006/0028282 A1     Feb. 9, 2006

Related U.S. Application Data

(60) Provisional application No. 60/599,260, filed on Aug. 4, 2004.

(51) Int. Cl.
*H03B 5/00*     (2006.01)
(52) U.S. Cl. ............................ 331/117 FE; 331/117 R; 331/167; 331/177 V; 331/179
(58) Field of Classification Search ............ 331/177 V, 331/117 FE, 117 R, 179, 167, 177 R
See application file for complete search history.

(56) References Cited

U.S. PATENT DOCUMENTS 5,434,543 A     7/1995  Brilka et al. ............ 331/117 R
6,806,785 B2*  10/2004  Traub ...................... 331/108 C
6,972,635 B2*  12/2005  McCorquodale et al. ... 331/167
7,005,936 B2*   2/2006  Tanzawa .................... 331/176
2006/0028281 A1*  2/2006  Sze et al. .................... 331/16
2006/0028283 A1*  2/2006  Sze et al. .................... 331/16

OTHER PUBLICATIONS

U.S. Appl. No. 11/420,118, filed May 2006, Sze et al.*

* cited by examiner

*Primary Examiner*—Arnold Kinkead
(74) *Attorney, Agent, or Firm*—K & L Gates LLP

(57) ABSTRACT

Improved voltage controlled oscillator (VCO) circuits are disclosed. A symmetrical voltage controlled oscillator (VCO) system according to the embodiments of the present invention comprises a frequency tuning circuit containing one or more varactors for receiving a predetermined tuning signal and a frequency tuning bias signal for altering capacitances of the varactors, a modulation circuit coupled in parallel with the frequency tuning circuit containing one or more varactors for modulating one or more outputs, and a core circuit coupled in a parallel with the tuning circuit and the modulation circuit for providing an oscillation mechanism, wherein the core circuit has an inductance module coupled in a parallel fashion with the frequency tuning circuit and the modulation circuit, wherein circuit elements of the VCO system are symmetrically arranged for increasing oscillation efficiency thereof and the varactors are tuned to deliver the output at an output frequency.

15 Claims, 6 Drawing Sheets

SIGNAL MODULATED VOLTAGE CONTROLLED OSCILLATOR SYSTEM

CROSS REFERENCE

This application claims the benefits of U.S. Provisional Patent Application Ser. No. 60/599,260, filed on Aug. 4, 2004, and entitled "HIGHLY LINEAR SIGNAL MODULATION VOLTAGE-CONTROLLED OSCILLATOR". This application further relates to co-pending applications entitled "HIGHLY-LINEAR SIGNAL-MODULATED VOLTAGE CONTROLLED OSCILLATOR" filed on Jan. 31, 2005, Application No. 11/047,835, and "SYMMETRICAL LINEAR VOLTAGE CONTROLLED OSCILLATOR," filed on Jan. 31, 2005, Application No. 11/048,456.

BACKGROUND

The present invention relates generally to semiconductor voltage controlled oscillator (VCO) devices, and more particularly to improved integrated designs of inductance-capacitance tank VCO devices.

The popularity of mobile telephones has placed exceptional attention to wireless architectures and circuit techniques. In addition, the reduction in scaling of complementary metal-oxide semiconductor (CMOS) technologies in recent years has resulted in significant improvements in the radio frequency (RF) performance of MOS devices. As an example of the CMOS RF technology improvements, single-chip transceiver designs have already been demonstrated using low-cost CMOS technology. RF CMOS integrated circuit (IC) technology has advanced to the point of commercial deployment.

One of the key elements of the wireless communications transceivers is voltage controlled oscillators (VCOs). They are part of the frequency synthesizer that generates the local oscillator (LO) signal for both up-conversion and down-conversion of the baseband signal. For monolithic integration into CMOS devices, inductance-capacitance (LC) tank oscillators are preferred over other oscillators due to its better relative phase noise performance and its low power consumption. Despite continuous improvements in VCOs, however, VCO design still remains both a bottleneck and the main challenge for RF transceiver design. These challenges include reducing phase noise, power consumption, and optimizing frequency tuning range. In LC tank VCOs, phase noise and power consumption depend primarily on the quality factor (Q) of the tank and the non-linearities of varactors, which are specially-designed P-N junction diodes, whose capacitance change significantly in the reverse bias mode. There are numerous varactor types: PN-junction, standard mode p/nMOS, or accumulation mode p/nMOS varactors. The frequency tuning range is determined by the capacitance tuning range of the varactor and the parasitic characteristics of the VCO. Therefore, the main task is to optimize the performance of the inductors and varactors. The control voltage applied to the VCO changes the capacitance value of the varactor, which determines the oscillation frequency of the VCO. The inductance, L, and the parallel capacitance, C, determine the oscillation frequency, f, of the VCO by the following equation:

$$f = 1/2\pi(LC)^{1/2}$$

Varactors are used to cover a certain frequency band. The active devices of the VCO overcome the losses in the tank. To reduce the phase noise of the VCO, the passive elements of the tank need to have large quality (Q) factors, since the quality factors of the tank quadratically influence the phase noise of the VCO. At frequencies suitable for mobile communications, the quality factors of integrated inductors are usually much lower than the quality factors of conventional diodes or MOS varactors. In these applications, the inductors determine the worst-case phase noise and whether or not the VCO specifications can be met.

The performance of integrated inductors is strongly influenced by losses through undesired currents in the substrate, or by the serial resistance of the inductor windings. In digital CMOS technologies, the thickness of the metal layers is much smaller than in bipolar and bi-CMOS technologies, thus leading to much higher serial resistances. Further the substrates are highly doped, thus leading to large substrate losses. Digital CMOS technologies allow the integration of both digital and analog functions on the same chip without exponentially increasing the cost of digital CMOS technology fabrication.

Moreover, conventional VCOs require a large die size, have low linearity, and have no signal modulation capability. The parasitic effects of the physical layout increase the variability of the set-on oscillator frequency. As such, oscillator frequency cannot be reliably predicted.

Therefore, desirable in the art of VCO designs are improved VCO designs with a smaller footprint, higher linearity, improved set-on oscillator frequency stability and signal modulation capability incorporated thereto.

SUMMARY

In view of the foregoing, this invention provides two VCO circuit topologies to improve VCO circuit performance.

Improved voltage controlled oscillator (VCO) circuits are disclosed. A symmetrical voltage controlled oscillator (VCO) system according to the embodiments of the present invention comprises a frequency tuning circuit containing one or more varactors for receiving a predetermined tuning signal and a frequency tuning bias signal for altering capacitances of the varactors, a modulation circuit coupled in parallel with the frequency tuning circuit containing one or more varactors for modulating one or more outputs, and a core circuit coupled in a substantially parallel fashion with the frequency tuning circuit and the modulation circuit for providing an oscillation mechanism, wherein the core circuit has an inductance module coupled in a substantially parallel fashion with the frequency tuning circuit and the modulation circuit, wherein circuit elements of the VCO system are symmetrically arranged for reducing phase noise and increasing oscillation efficiency thereof.

The construction and method of operation of the invention, however, together with additional objects and advantages thereof will be best understood from the following description of specific embodiments when read in connection with the accompanying drawings.

DESCRIPTION

The following will provide a detailed description of improved VCO circuits according to various embodiments of the present invention. Various embodiments illustrate how various capacitance and inductance devices are adjusted so that the collective capacitance and inductance of the VCO are tuned for delivering an output at a selected frequency or over a frequency band if the output is modulated.

Figure 1:
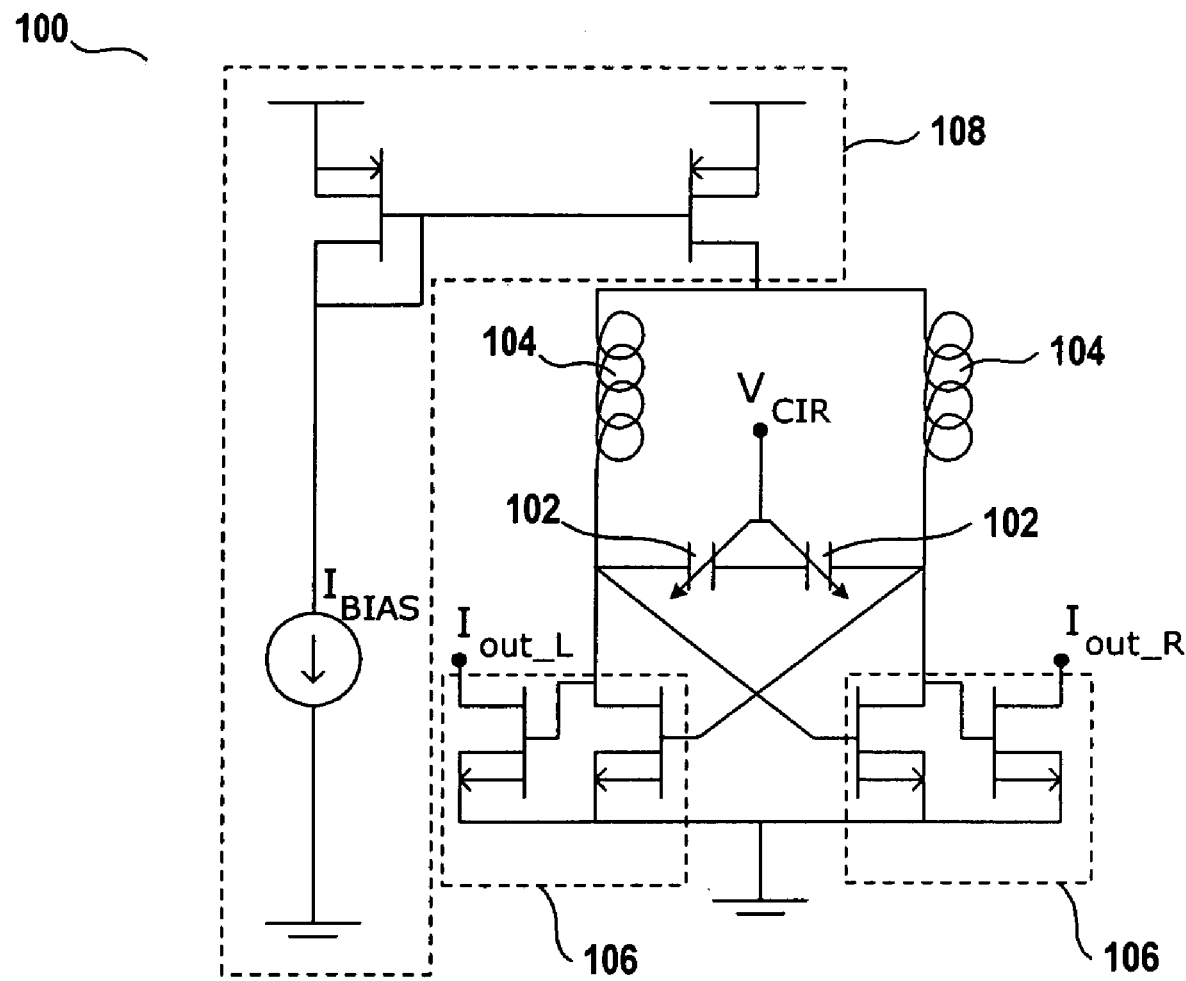
FIG. 1 presents a conventional LC tank VCO circuit.

FIG. 1 presents a conventional LC tank VCO circuit 100. The circuit 100 comprises two varactors 102, two inductors 104, two NMOS cross-coupled MOSFET structures 106, and a constant current power source 108. The NMOS cross-coupled MOSFET structures 106 provide the necessary negative resistance to cancel the loss of the resonator. According to the Barkhaussen rule, oscillations occur when the loop gain is larger than one and when the image portion of the impedance is zero. The VCO oscillation frequency is determined by the equation:

$$f=1/2\pi(LC)^{1/2}$$

where L is the total inductance of the two inductors 104, and C is the network capacitance comprising the capacitance of the two varactors 102 and a circuit parasitic capacitance.

Since this design does not utilize a symmetrical topology, the parasitic capacitances could be quite large and indeterminable. Thus, the VCO output frequency can not be predicted with any accuracy with a large parasitic capacitance of the circuit 100. It is noted that the circuit 100 does not have a built-in modulation capability, and therefore requires an external modulation circuit. The circuit 100 also has low linearity, thereby producing additional flicker noise in the output. Due to the asymmetrical topology of this design, even-mode harmonics are not suppressed. Because of the above factors, the loaded quality factor of the total LC tank circuit cannot be predicted reliably and accurately.

Figure 2:
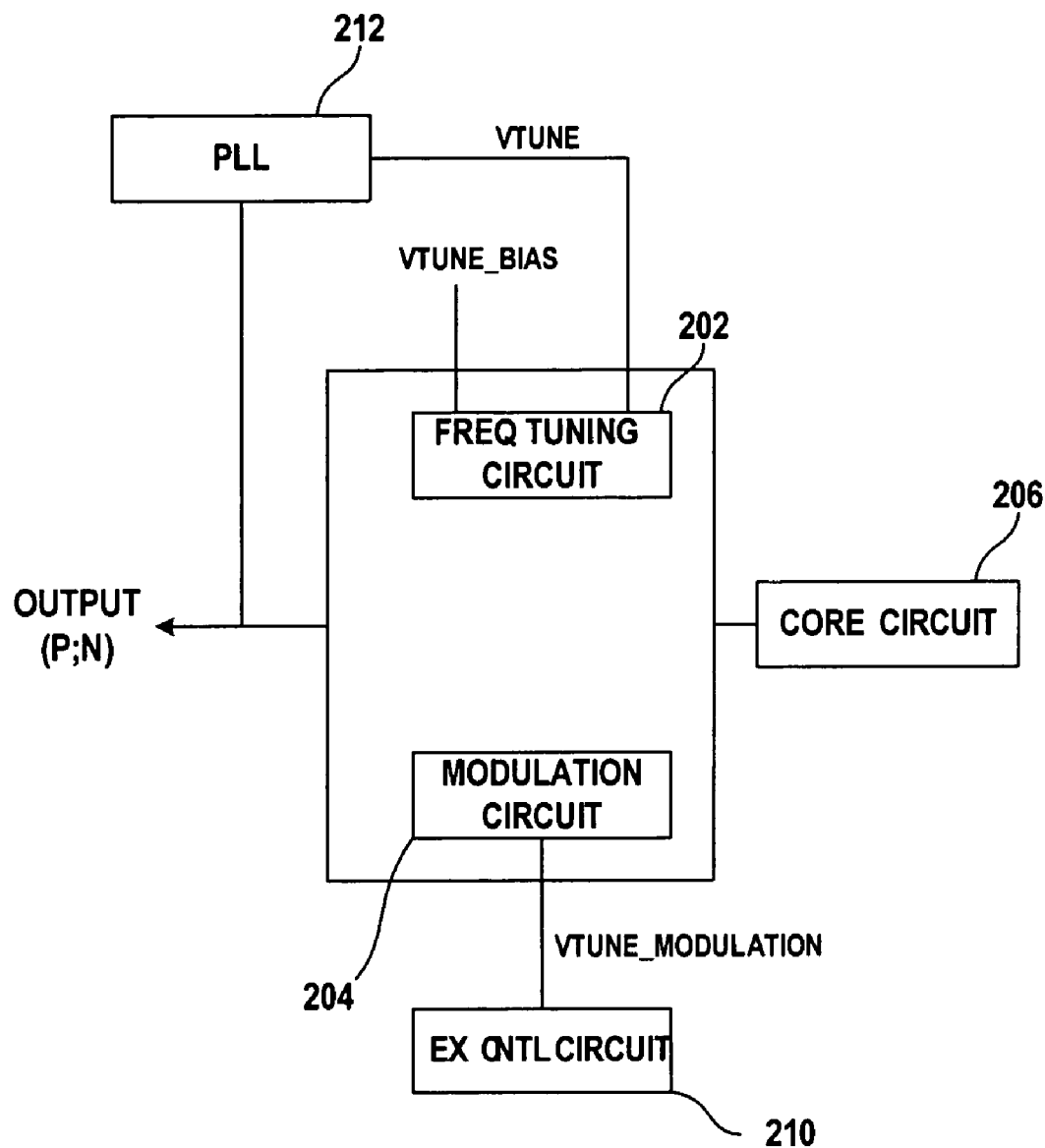
FIG. 2 presents a block diagram of a high-linearity, signal-modulated symmetrical LC tank VCO circuit in accordance with one embodiment of the present invention.

FIG. 2 presents a block diagram of a high-linearity, signal-modulated symmetrical LC tank VCO circuit 200 in accordance with one embodiment of the present invention. The circuit 200 comprises a carrier frequency tuning circuit 202, a carrier modulation circuit 204, a core circuit 206, and VCO outputs such as OUTPUT_P and OUTPUT_N. Since the VCO outputs are at a particular output frequency, they can also be referred to as carrier outputs. A frequency tuning bias signal, VTUNE_BIAS, may provide predetermined voltage such as a fixed voltage to the VCO to tune the circuit 200. Depending upon the VCO circuit design, the VCO may contain just one or multiple frequency bands. The fixed voltage level is dependent upon the type of varactors in a high-linearity signal-modulated varactor circuit, such as PN-junction, standard mode P/NMOS, or accumulation mode P/NMOS. This circuit will be discussed in detail in FIG. 3.

The VCO circuit 200 is further optionally coupled with an external control circuit 210 such as an analog baseband (ABB) circuit, which provides a modulation control signal VTUNE_MODULATION, and further coupled to a phase lock loop (PLL) frequency synthesizer, or simply, PLL module 212. If necessary, the VTUNE_BIAS signal can be generated by the external control circuit 210. The PLL module 212, external to the VCO, utilizes a tuning signal VTUNE (e.g., a phase-locked feedback signal) for locking the phase of the output when the output frequency is locked. It is understood that VTUNE and VTUNE_BIAS together control the varactors of the frequency tuning circuit and the VTUNE_BIAS does not have to be locked to a fixed voltage as these two signals work jointly to alter the total capacitance of the varactors. The VCO output is sent to the PLL module and is sampled by the PLL to maintain the output frequency and phase stability. The PLL module 212 provides precise VCO output frequency control as well as phase control by varying the voltage VTUNE, applied to the carrier frequency varactors in the carrier frequency tuning circuit 202, that changes the varactor's capacitance. As such, by changing the capacitance and inductance or LC tank characteristics, the output oscillation frequency will be changed. The VTUNE_MODULATION signal may vary its voltage, when applied to the modulation varactors in the carrier modulation circuit 204, that changes the varactor's capacitance, and hence the modulation of the output frequency. Any modulation type may be utilized to modulate the VCO output frequency such as AM (amplitude modulation), FM (frequency modulation), FSK (frequency shift keying), etc. It is noted that without the modulation, the output from the VCO is on a particular output frequency, while with the modulation, the output is presented as a waveform carried by a modulated carrier frequency. The magnitude of the output in either case is largely determined by a quality factor Q of the circuit.

Figure 3:
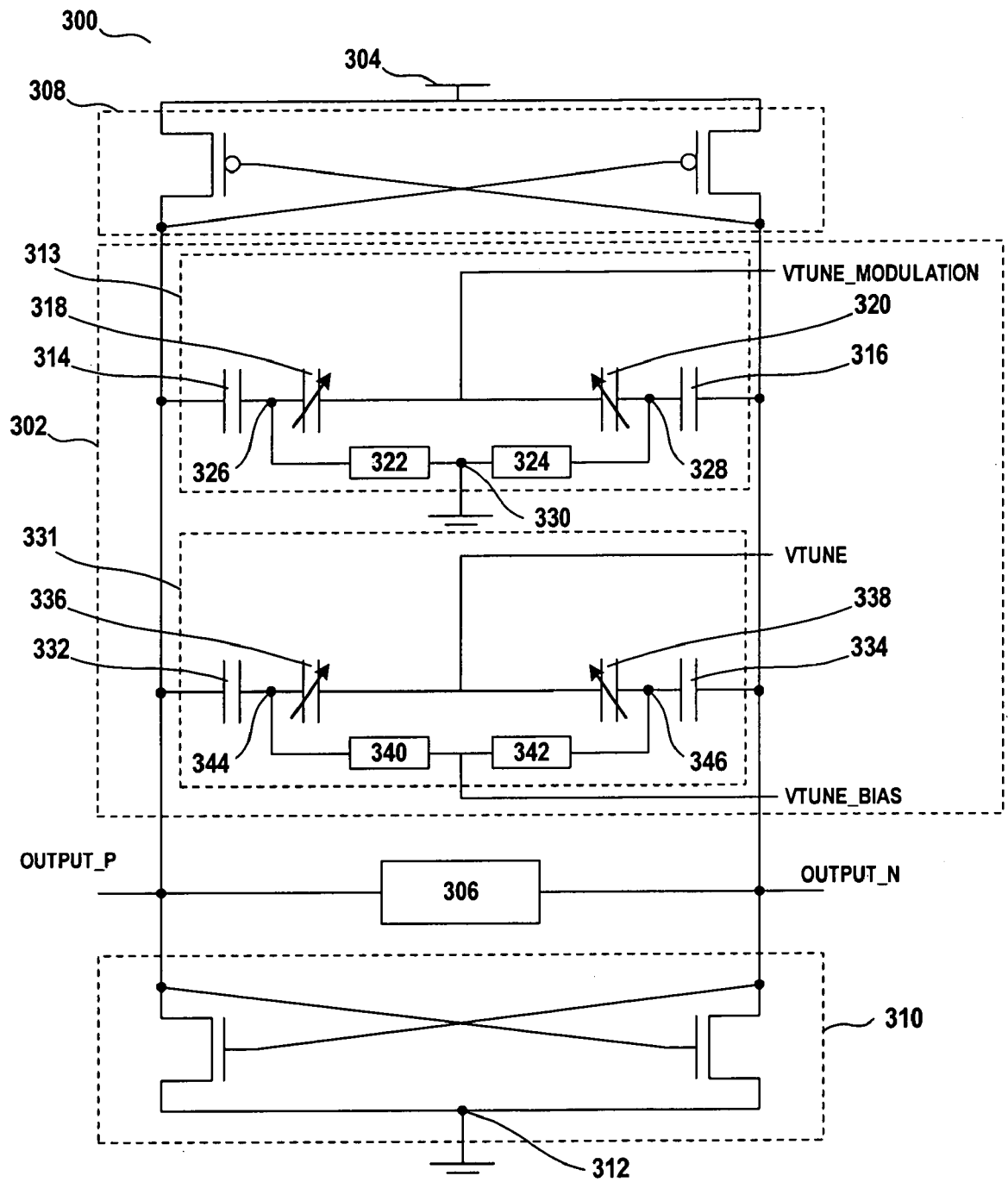
FIG. 3 presents a separated, symmetrical LC tank VCO circuit in accordance with another embodiment of the present invention.

FIG. 3 presents a separated, symmetrical LC tank VCO circuit 300 in accordance with the first embodiment of the present invention. The circuit 300 includes a highly-linear, signal-modulated varactor circuit 302, a core circuit including a power source 304, an inductor 306, a pair of PMOS/NMOS cross-coupled transistor structures 308 and 310, and two VCO outputs OUTPUT_P and OUTPUT_N. It is understood that the two VCO outputs are complementary to each other. From manufacturing perspective, the circuit 300 can be fabricated on a semiconductor substrate such as a P-type substrate using standard CMOS fabrication processes.

The circuit 300 receives its power from the power source 304 such as VCC or another current source, and is connected to an electrical ground 312 or VSS. The circuit 300 is fabricated on the CMOS substrate, thereby resulting in a smaller footprint and hence a lower fabrication cost structure than in conventional VCO designs. The topology of the circuit 300 has excellent symmetry in that the circuit designs of the cross-connected transistor structures 308 and 310, the varactor circuit 302, and the inductor 306 are symmetrical designs. This symmetrical VCO design reduces the even-mode VCO harmonics, and significantly reduces the flicker noise in the VCO output compared to conventional VCO designs. It is understood that the inductance module 306 provides a predetermined inductance to the circuit 300 and connects to both outputs on two sides thereof. In this embodiment, it is assumed that this inductor does not have an alterable inductance so that the frequency tuning is largely carried out through the tuning of the varactors. However, it is understood that the inductor can be made in such a manner so that the inductance is a controllable variable.

In this embodiment, the varactor circuit 302 is a "separated" design in that a modulation circuit 313 and a frequency tuning circuit 331 are two relatively independent circuits. The separation of the modulation circuit 313 and the frequency tuning circuit 331 allows for the implementation of either just one or both of the circuits to meet a particular design specification, thereby requiring a smaller footprint as the modulation can be an optional feature.

The modulation circuit 313 of the varactor circuit 302 includes capacitors 314 and 316 connected in series respectively with varactors 318 and 320, thereby increasing circuit linearity. In this embodiment, the varactors 318 and 320 are PMOS or NMOS varactors. The circuit 313 provides a high linearity varactor circuit capable of utilizing any modulation type. The capacitors 314 and 316 are also in series with resistors 322 and 324 respectively. The resistor 322 supplies a determinable or relatively fixed voltage at a node 326, which connects the capacitor 314 and the varactor 318 on both sides, while the resistor 324 supplies a determinable or relatively fixed voltage at a node 328, which connects the capacitor 316 and the varactor 320 on both sides. There are two low pass filters within this structure for eliminating external noises: the resistor 322 and the capacitor 314, and the resistor 324 and the capacitor 316. The circuit 300 is tied to the device ground at a node 330, which is a mid point between the two resistors. This node, if not connected to ground, it can still be viewed as a virtual AC ground as the circuit is set up as a differential model. As shown, the varactors 318 and 320 are coupled in a substantially parallel fashion with the resistors 322 and 324. The circuit 300 output is modulated by applying the modulation signal VTUNE_MODULATION to a mid point between the varactors 318 and 320. The voltage applied thereto changes the capacitance values of the varactors 318 and 320. As the capacitance changes, the frequency is also altered. It is understood that the VCO output frequency can be modulated using AM (amplitude modulation), FM (frequency modulation), FSK (frequency shift keying) or other modulation types.

The frequency tuning circuit 331 of the varactor circuit 302 controls the output frequency and phase. The output frequency is adjusted through the control of two signals VTUNE_BIAS and VTUNE. With the VTUNE signal provided by the PLL module, it is used to close a control loop to maintain the output frequency and phase stability. Capacitors 332 and 334 are respectively coupled in series with varactors 336 and 338, thereby increasing circuit linearity. The capacitors 332 and 334 are also in series with resistors 340 and 342, respectively. The resistor 340 and the capacitor 332 combination, similar to the resistor 342 and the capacitor 334, can be seen as a differential low-pass filter that is used to eliminate external noise. The VTUNE_BIAS signal may be provided by a voltage source external to the circuit 300 and supplies a relatively fixed voltage through the resistors 340 and 342 to nodes 344 and 346, which connect to the capacitor 332 and the varactor 336, and to the capacitor 334 and the varactor 338 respectively. It is understood that the voltage level provided by the voltage source is dependent upon the type of varactors in the varactor circuit 302, such as PN-junction, standard mode p/nMOS, or accumulation mode p/nMOS varactors. This stable frequency tuning bias signal VTUNE_BIAS provides a reference voltage and along with the signal VTUNE help to alter the capacitance of the varactor 338 thereby tuning the output frequency of the circuit 300 to a predetermined frequency. It should be understood that the output frequency is determined collectively by all the capacitors, varactors, and inductors of the circuit 300, and the use of VTUNE and VTUNE_BIAS is only one way to adjust the frequency. Furthermore, the provided VTUNE_BIAS signal helps to stabilize the output and avoid flicker noise. As it is understood, a proper choice of the electrical characteristics of the varactor circuit may significantly reduce the up-conversion of flicker noise.

In this embodiment, the core circuit is coupled in parallel to the frequency tuning circuit and the modulation circuit. The core circuit provides the power source and other elements for producing oscillation, from which an output frequency can be generated by selectively tuning through the above illustrated tuning mechanism. As shown, there is at least one PMOS cross-coupled transistor structure 308 having at least a pair of cross-coupled PMOS transistors with sources thereof coupled to a power source. Similarly, there is at least one NMOS cross-coupled transistor structure having at least a pair of cross-coupled NMOS transistors with sources thereof coupled to a second power supply that complements VCC such as an electrical ground GND or VSS of the circuit. The drains of the PMOS and NMOS transistors are coupled to at least one output, either the first or second outputs. The cross-couple arrangement is such that a gate of a PMOS or NMOS transistor is cross-coupled to a drain of another PMOS or NMOS transistor of the corresponding pair. The transistor structures 308 and 310 provide the necessary negative resistance to increase the power source for compensating the losses of the parallel LC resonator tank.

It is understood that since the output frequency is dependent on the total values of all capacitance and inductance provided by various components in the VCO circuit, the integration of the varactors 332, 334, 336 and 338 with the inductor 306 to form the VCO LC tank contributes significantly to the performance of the circuit 300. If the modulation circuit is included, the capacitance devices 314, 316, 318, and 320 also contribute to the final performance of the VCO circuit. Mathematically, the relation of the output frequency and the varactors and the inductor 306 can be presented as follows:

$$f=1/((C1+C2)L)^{1/2}$$

where C1 is the total capacitance of the varactors 318 and 320, C2 is the total capacitance of the varactors 336 and 338, and L is the inductance of the inductor 306. As it is presented, when C1 and C2 are altered with the L unchanged, the output frequency is largely determined. In addition, the proper symmetrical design of the aforesaid components reduces the inductor and circuit parasitic capacitance, thereby reducing even mode harmonic and flicker noise, and phase noise interference.

One advantage of the varactor circuit 302 is its excellent linearity. The serial alignment of the capacitors 314 and 316 with the varactors 318 and 320, and that of the capacitors 332 and 334 with the varactors 336 and 338, increase the linearity of the varactor circuit 302. In the circuit 300, the PMOS/NMOS cross-coupled transistor structures 308 and 310, the inductor 306, and the circuits 313 and 331, are all placed symmetrically. This symmetry reduces the even-mode VCO harmonics, and further reduces the flicker noise in the VCO output compared to conventional VCO designs. The symmetrical design of the circuit 300 significantly reduces the parasitic capacitances within the circuit, thereby providing output frequency stability and output frequency set-on accuracy during the design stage. For this embodiment, another advantage of the varactor circuit 302 is the built-in signal modulation and PLL functions. The built-in modulation function eliminates the need for an external signal modulator, which reduces the chip size (35 to 45% size reduction) and reduces fabrication costs. Further, the built-in low-pass filter eliminates the external noise without additional components. Finally, by separating the tuning and modulation circuitries, this embodiment allows for a reduced chip size if the modulation circuit is not required in the design specification.

This embodiment utilizes a complementary cross-coupled topology with a symmetrical inductor design. Compared with conventional designs that use asymmetrical inductors, this new design can improve output voltage swing and phase noise by 65% and 2.3 dB, respectively, for a given level of power consumption, as shown by some experiments. At the same time, the required chip area can be reduced as much as 36%, compared to conventional inductor designs.

Figure 4A:
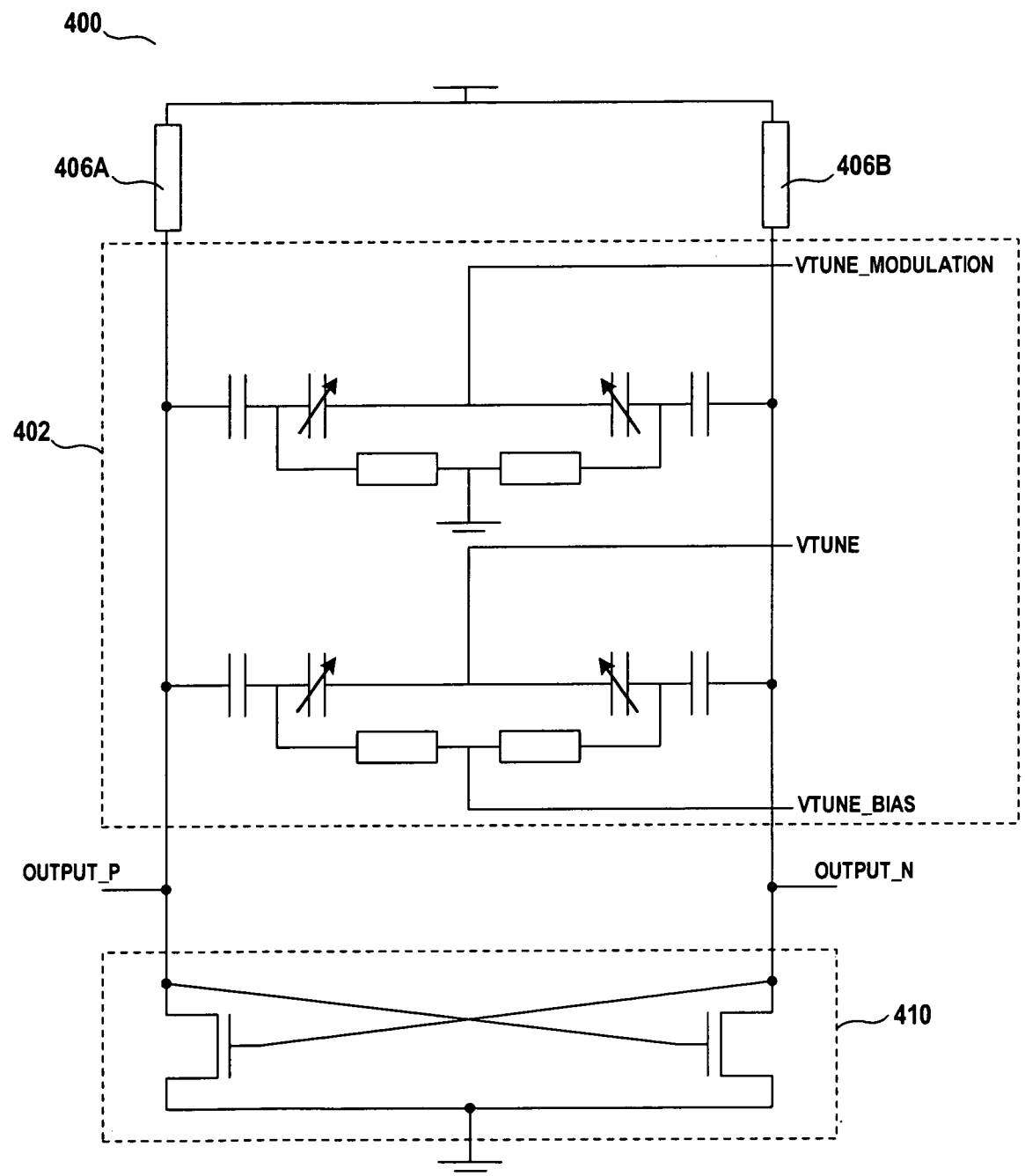
FIGS. 4A and 4B present another separated, symmetrical LC tank VCO circuit in accordance with another embodiment of the present invention.
Figure 4B:
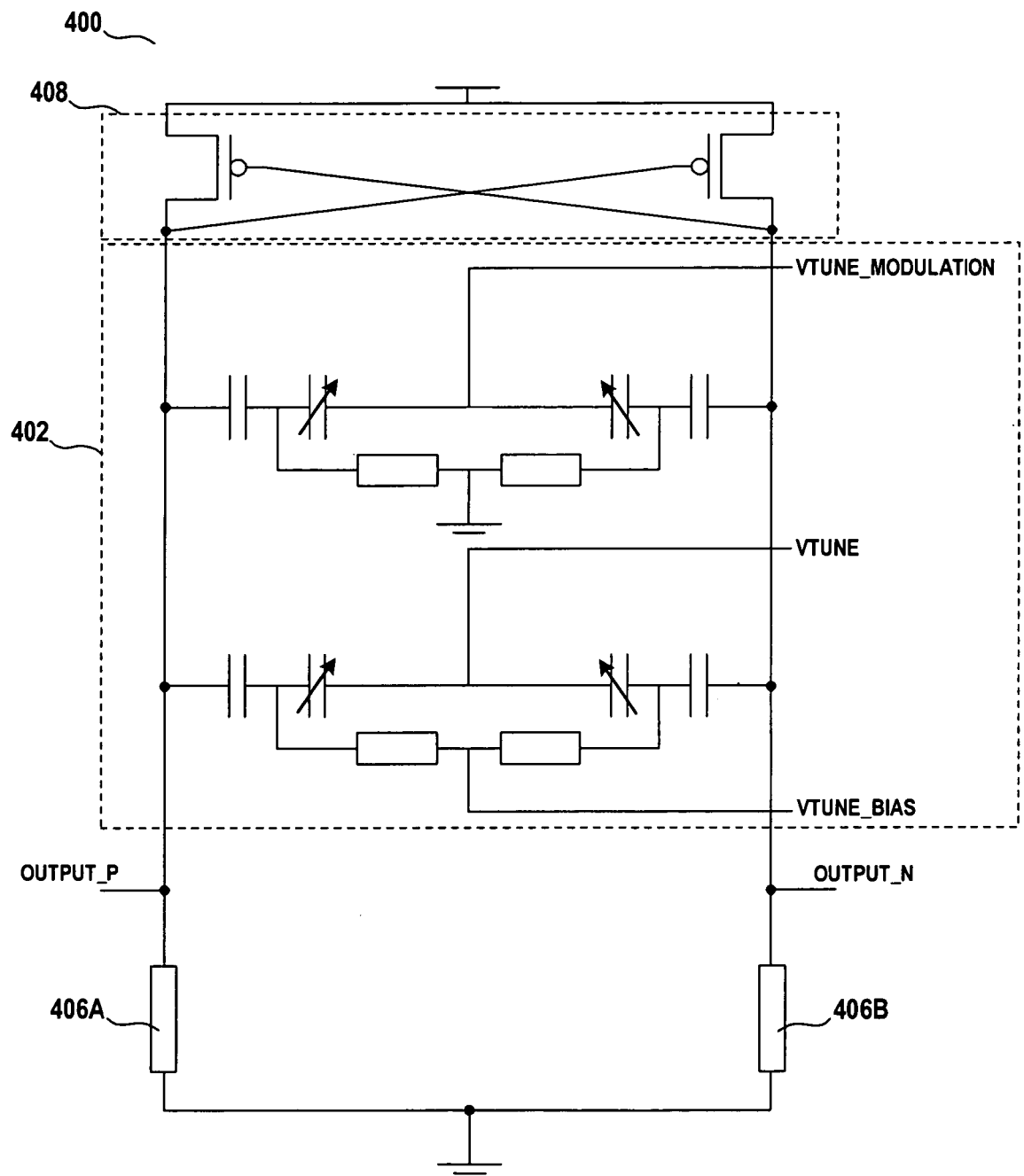

FIGS. 4A-4B present two separated, symmetrical LC tank VCO circuit 400 in accordance with another embodiment of the present invention. In FIG. 4A, the varactor circuit 402 is identical to circuit 302 in the circuit 300. However, the inductor 306 has been divided into two symmetrical sections 406A and 406B. Two output signals OUTPUT_P and OUTPUT_N continue to provide circuit outputs. Also, while the structure 308 is now absent, the NMOS cross-coupled structure 410 remains. The circuit 400 has performance characteristics and advantages similar to those of the circuit 300. Similarly, in FIG. 4B, the two inductor modules 406A and 406B can be placed close to ground instead of the positive power supply (e.g., VCC), replacing the cross coupled transistor structure 310 of FIG. 3 with the transistor structure 408 remained in the circuit.

Figure 5:
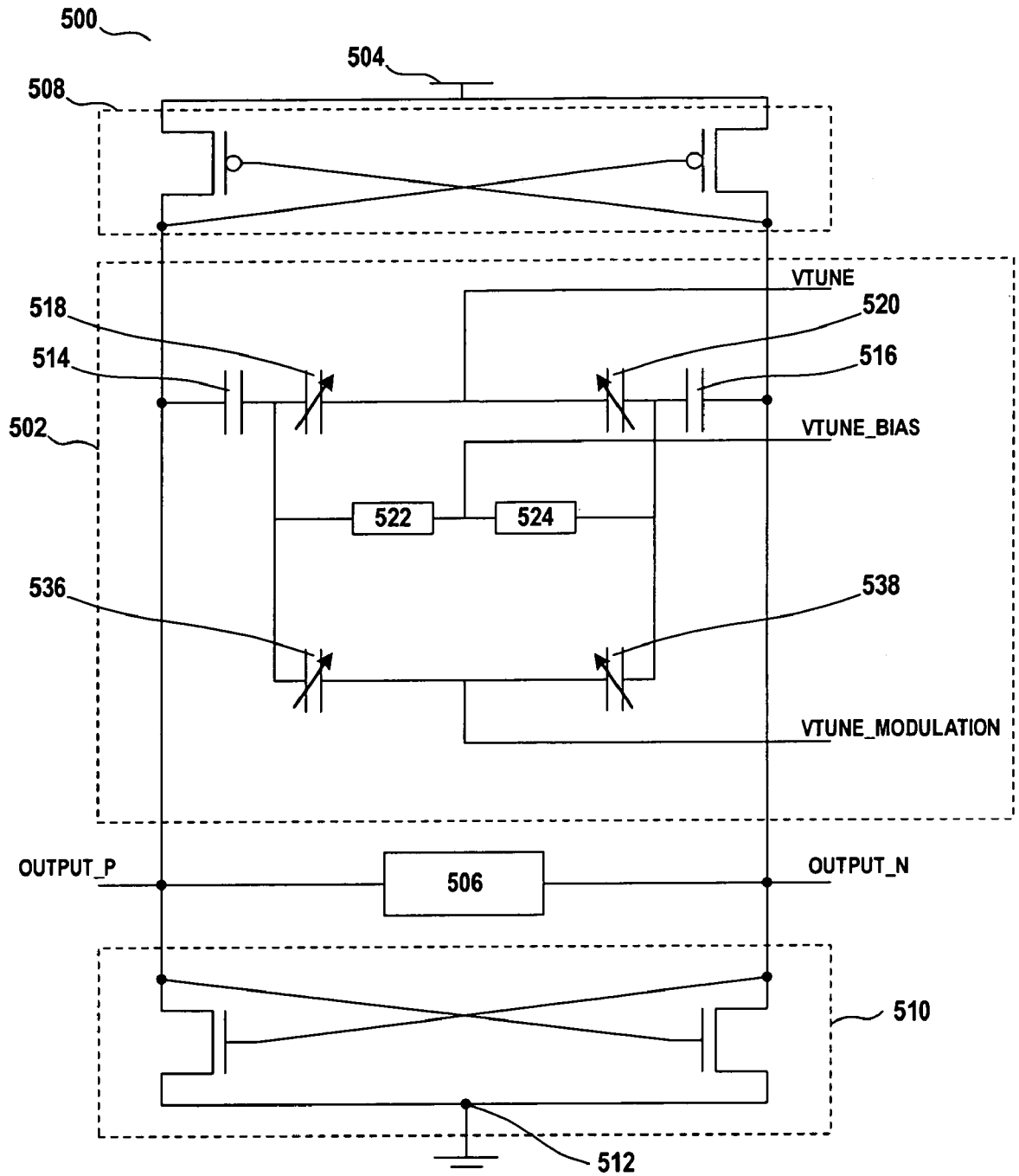
FIG. 5 presents an integrated, symmetrical LC tank VCO circuit in accordance with another embodiment of the present invention.

FIG. 5 presents an integrated, symmetrical LC tank VCO system 500 in accordance with another embodiment of the present invention. In this embodiment, a highly-linear, signal-modulated varactor circuit 502 exhibits an "integrated" design in that circuitries for modulation and frequency tuning are electrically and physically combined. Comparing to the circuit 300, the VCO system 500 does not require the capacitors 332 and 334, and the resistors 340 and 342. By reducing the number of components and integrating functionalities, a smaller footprint is permitted. After the integration of these circuitries, the circuit parasitic effects can be easily compensated for, thus allowing for easy and precise calculation of the overall loaded quality factor of the VCO system. A core circuit including an inductor 506 and two cross-coupled transistor structures 508 and 510 are identical to that shown in the circuit 300. Similarly, the VCO system 500 is powered by two power supply lines, e.g., a constant power source 504 and an electrical ground 512. The ground connection point 512 can be viewed as an AC virtual ground. This AC virtual ground at the mid point of the VCO system 500 reduces the series resistance of the LC tank circuit, thus improving the quality factor of the LC tank.

The combined tuning and modulation part of the varactor circuit 502 controls the output frequency and phase. A capacitor 514 is in series with a varactor 518, while a capacitor 516 is in series with a varactor 520, thereby increasing the linearity of the tuning part of the varactor circuit 502. In the tuning part of the varactor circuit 502, the varactors 518 and 520 are CMOS varactors, and provide the PLL function. The capacitors 514 and 516 are also in series with resistors 522 and 524, respectively. The resistor 522 and the capacitor 514, and similarly, the resistor 524 and the capacitor 516, can be seen as two low-pass filter that is used to eliminate external noise. A VTUNE_BIAS signal is connected to a voltage source that is external to the VCO system 500 and supplies a fixed voltage at the junction between the resistors 522 and 524. The fixed voltage level is dependent upon the type of varactors in the varactor circuit 502. A VTUNE signal is provided to the junction between two varactors 518 and 520. The VTUNE and VTUNE_BIAS signals together control the adjustment of the varactors 518 and 520.

The modulation part of the varactor circuit 502 includes the capacitors 514 and 516, which are in series with varactors 536 and 538. A modulation signal VTUNE_MODULATION directs the modulation by applying a voltage at the node between the varactors 536 and 538. The varactors 536 and 538 are MOS varactors in this example. This modulation part of the varactor circuit 502 provides a high linearity varactor circuit capable of utilizing any modulation type and this circuit's small VCO gain ($K_{VCO}$) allows for easy modulation. It is understood that the VCO output frequency can be modulated using AM (amplitude modulation), FM (frequency modulation), FSK (frequency shift keying) or other modulation types.

This embodiment integrates the functionalities of a high-linearity signal-modulated varactor circuit. Although the frequency tuning part and the modulation part are integrated, they can still be viewed as in a substantially parallel arrangement. The circuit elements, like the ones in the separated model, are arranged in a substantially symmetrical fashion. This integration allows the circuit parasitic effects to be easily compensated for, thus allowing for easy and precise calculation of the overall loaded quality factor. This embodiment also eliminates some circuit components, thereby reducing the footprint and cost while maintaining the performance advantages.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A symmetrical voltage controlled oscillator (VCO) system comprising:
    a frequency tuning circuit containing one or more varactors for receiving a predetermined tuning signal and a frequency tuning bias signal for altering capacitances of the varactors;
    a modulation circuit coupled in parallel with the frequency tuning circuit containing one or more varactors for modulating one or more outputs, wherein the modulation circuit further includes:
    a first capacitor and a second capacitor coupled in series and to a first output and a second output that is complementary to the first output on their first ends respectively; and
    a first resistor and a second resistor coupled in series with and between the first and second capacitors with a mid point between the first and second resistors coupled to ground; and
    a core circuit coupled in a parallel with the frequency tuning circuit and the modulation circuit for providing an oscillation mechanism, wherein the core circuit further includes:

at least one PMOS cross-coupled transistor structure having at least a pair of cross-coupled PMOS transistors with sources thereof coupled to a power source; and at least one NMOS cross-coupled transistor structure having at least a pair of cross-coupled NMOS transistors with sources thereof coupled to an electrical ground, wherein circuit elements of the VCO system are symmetrically arranged and the varactors are tuned to deliver the outputs at an output frequency.

2. The system of claim 1 wherein the core circuit further includes an inductance module coupled in a parallel fashion with the frequency tuning circuit and the modulation circuit.

3. The system of claim 1, wherein the frequency tuning bias signal is a fixed voltage.

4. The system of claim 1 further comprising an external control circuit for providing a modulation signal.

5. The system of claim 1 further comprising a phase lock loop module for providing the tuning signal based on the one or more outputs.

6. The system of claim 1, wherein the frequency tuning circuit further includes:
a first capacitor and a second capacitor coupled to the first output and the second output that is complementary to the first output on their first ends respectively;
a first varactor and a second varactor coupled in series with and between the first and second capacitors with a mid point between the first and second varactors coupled to the tuning signal; and
a first resistor and a second resistor coupled in series with and between the first and second capacitors with a mid point between the first and second resistors coupled to the frequency tuning bias signal,
wherein the first and second resistors are coupled in a substantially parallel fashion with the first and second varactors and together coupled to the first and second capacitors on their second ends in series.

7. The system of claim 1, wherein the modulation circuit further includes:
a first varactor and a second varactor coupled in series with and between the first and second capacitors with a mid point between the first and second varactors coupled to the modulation signal,
wherein the first and second resistors are coupled in a parallel fashion with the first and second varactors and together coupled to the first and second capacitors on their second ends in series.

8. The system of claim 1 wherein the varactors are PN-junction, standard mode NMOS/PMOS, or accommodation mode NMOS/PMOS types.

9. A symmetrical voltage controlled oscillator (VCO) system comprising:
a frequency tuning circuit containing one or more varactors for receiving a predetermined tuning signal and a frequency tuning bias signal for altering capacitances of the varactors, wherein the frequency tuning circuit further includes:
a first capacitor and a second capacitor coupled to a first output and a second output that is complementary to the first output on their first ends respectively;
a modulation circuit coupled in parallel with the frequency tuning circuit containing one or more varactors for modulating one or more outputs using at least one modulation signal, wherein the modulation circuit further includes:

a first capacitor and a second capacitor coupled in series and to the first output and the second output on their first ends respectively; and
a first resistor and a second resistor coupled in series with and between the first and second capacitors with a mid point between the first and second resistors coupled to ground;
a phase lock loop module for providing the tuning signal based on the one or more outputs; and
a core circuit coupled in a parallel with the frequency tuning, circuit and the modulation circuit for providing an oscillation mechanism, the core circuit having at least one inductance module, wherein the core circuit further includes:
at least one PMOS cross-coupled transistor structure having at least a pair of cross-coupled PMOS transistors with sources thereof coupled to a power source; and
at least one NMOS cross-coupled transistor structure having at least a pair of cross-coupled NMOS transistors with sources thereof coupled to an electrical ground,
wherein circuit elements of the VCO system are symmetrical arranged and the varactors are tuned to deliver the outputs at an output frequency.

10. The system of claim 9, wherein the frequency tuning circuit further includes:
a first varactor and a second varactor coupled in series with and between the first and second capacitors with a mid point between the first and second varactors coupled to the tuning signal; and
a first resistor and a second resistor coupled in series with and between the first and second capacitors with a mid point between the first and second resistors coupled to the frequency tuning bias signal,
wherein the first and second resistors are coupled in a substantially parallel fashion with the first and second varactors and together coupled to the first and second capacitors on their second ends in series.

11. The system of claim 9, wherein the modulation circuit further includes:
a first varactor and a second varactor coupled in series with and between the first and second capacitors with a mid point between the first and second varactors coupled to the modulation signal,
wherein the first and second resistors are coupled in a parallel fashion with the first and second varactors and together coupled to the first and second capacitors on their second ends in series.

12. A symmetrical voltage controlled oscillator (VCO) system comprising;
a frequency tuning circuit containing one or more varactors for receiving a predetermined tuning signal and a frequency tuning bias signal for altering capacitances of the varactors;
a modulation circuit containing one or more varactors for modulating one or more outputs, wherein the modulation circuit further includes:
a first capacitor and a second capacitor coupled in series and to a first output and a second output on their first ends respectively; and
a first resistor and a second resistor coupled in series with and between the first and second capacitors with a mid point between the first and second resistors coupled to ground; and
a core circuit coupled in a parallel with the frequency tuning circuit and the modulation circuit for providing an oscillation mechanism, the core circuit having at least one inductance module, wherein the core circuit further includes:

at least one PMOS cross-coupled transistor structure having at least a pair of cross-coupled PMOS transistors with sources thereof coupled to a power source; and at least one NMOS cross-coupled transistor structure having at least a pair of cross-coupled NMOS transistors with sources thereof coupled to an electrical ground, wherein circuit elements of the VCO system are symmetrically arranged and the varactors are tuned to deliver the outputs at an output frequency, and wherein the frequency tuning circuit and the modulation circuit are integrated to include:

a first capacitor and a second capacitor to be coupled to a first ouput and its complementary second output on their first ends respectively;

a first group of varactors having a first varactor and a second varactor coupled in series with and between the first and second capacitors with a mid point between the first and second varactors coupled to the tuning signal;

a resistor group coupled in parallel with the first group of varactors having a first resistor and a second resistor coupled in series with and between the first and second resistor capacitors with a mid point between the first and second resistors coupled to frequency tuning bias signal; and a second group varactors coupled in parallel with the first group of varactors having a third varactor and a fourth varactor coupled in series with and between the first and second capacitors with a mid point between the third and fourth varactors coupled to a modulation signal, wherein the first and second varactor groups and the resistor group together are coupled in series with the first and second capacitors on their second ends.

13. The system of claim 12 further comprising a phase lock loop module for providing the tuning signal based on the one or more outputs.

14. The system of claim 13 further comprising an external control circuit for providing the modulation signal.

15. The system of claim 14 wherein the varactors are MOS varactors.

* * * * *